United States Patent
Zhu

(10) Patent No.: US 10,153,432 B2
(45) Date of Patent: Dec. 11, 2018

(54) RESISTIVE RANDOM ACCESS MEMORY STRUCTURE AND MANUFACTURING METHOD THEREOF

(71) Applicant: United Microelectronics Corp., Hsinchu (TW)

(72) Inventor: Mengkai Zhu, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/594,498

(22) Filed: May 12, 2017

(65) Prior Publication Data

US 2018/0331282 A1    Nov. 15, 2018

(51) Int. Cl.
*H01L 27/24* (2006.01)
*H01L 45/00* (2006.01)
*G11C 13/00* (2006.01)

(52) U.S. Cl.
CPC ...... *H01L 45/1233* (2013.01); *G11C 13/0002* (2013.01); *H01L 27/2409* (2013.01); *H01L 45/1253* (2013.01); *H01L 45/16* (2013.01)

(58) Field of Classification Search
CPC . H01L 45/1233; H01L 45/1253; H01L 45/16; H01L 27/2409; G11C 13/0002
See application file for complete search history.

(56) References Cited

U.S. PATENT DOCUMENTS

| 8,963,114 B2 | 2/2015 | Liao et al. | |
| 2009/0090899 A1* | 4/2009 | Lim | H01L 27/2436 257/4 |
| 2010/0110320 A1* | 5/2010 | Kitakado | G02F 1/136286 349/39 |
| 2013/0056820 A1* | 3/2013 | Jeong | H01L 27/0688 257/324 |
| 2013/0112935 A1* | 5/2013 | Himeno | H01L 45/1253 257/4 |
| 2017/0117467 A1* | 4/2017 | Chang | H01L 45/08 |

\* cited by examiner

*Primary Examiner* — Fei Fei Yeung Lopez
(74) *Attorney, Agent, or Firm* — J.C. Patents

(57) ABSTRACT

A resistive random access memory (RRAM) structure including a substrate, RRAM cells and protection layers is provided. The RRAM cells are adjacent to each other and disposed on the substrate. The protection layers are disposed respectively on sidewalls of the RRAM cells without covering top surfaces of the RRAM cells. Each of the protection layers includes a sidewall portion and an extension portion. The sidewall portion is disposed on each of the sidewalls of each of the RRAM cells. The extension portion is connected to a lower portion of the sidewall portion. An upper portion of the extension portion is lower than an upper portion of the sidewall portion. The extension portion is connected between the sidewall portions in a region between the RRAM cells.

20 Claims, 4 Drawing Sheets

RESISTIVE RANDOM ACCESS MEMORY STRUCTURE AND MANUFACTURING METHOD THEREOF

BACKGROUND OF THE INVENTION

Field of the Invention

The invention relates to a semiconductor structure and a manufacturing method thereof, and particularly relates to a resistive random access memory (RRAM) structure and a manufacturing method thereof.

Description of Related Art

In the RRAM process, since the width of the spacer of the RRAM cell is too small, the subsequent etching process will etch through the spacer that causes the failure of the electrical performance of the RRAM.

SUMMARY OF THE INVENTION

The invention provides a RRAM structure and a manufacturing method thereof, which can improve the electrical performance of the RRAM.

The invention provides a resistive random access memory (RRAM) structure including a substrate, RRAM cells and protection layers. The RRAM cells are adjacent to each other and disposed on the substrate. The protection layers are disposed respectively on sidewalls of the RRAM cells without covering top surfaces of the RRAM cells. Each of the protection layers includes a sidewall portion and an extension portion. The sidewall portion is disposed on each of the sidewalls of each of the RRAM cells. The extension portion is connected to a lower portion of the sidewall portion. An upper portion of the extension portion is lower than an upper portion of the sidewall portion. The extension portion is connected between the sidewall portions in a region between the RRAM cells.

According to an embodiment of the invention, in the RRAM structure, each of the RRAM cells may include a bottom electrode, a top electrode and a variable resistance layer. The bottom electrode is disposed on the substrate. The top electrode is disposed on the bottom electrode. The variable resistance layer is disposed between the top electrode and the bottom electrode.

According to an embodiment of the invention, in the RRAM structure, the top electrode may be single-layer structure or a multi-layer structure.

According to an embodiment of the invention, in the RRAM structure, each of the RRAM cells may further include a hard mask layer. The hard mask layer is disposed on the top electrode.

According to an embodiment of the invention, the RRAM structure may further include a first interconnect structure and a second interconnect structure. The first interconnect structure is electrically connected to the bottom electrode. The second interconnect structure is electrically connected to the top electrode.

According to an embodiment of the invention, in the RRAM structure, the first interconnect structure and the second interconnect structure may be respectively a via, a trench or a combination thereof.

According to an embodiment of the invention, in the RRAM structure, the sidewall portions may be separated from each other in the region between the RRAM cells.

According to an embodiment of the invention, in the RRAM structure, a ratio of a width of each of the sidewall portions to a distance between the RRAM cells is more than or equal to 0.2 and less than 0.5, for example.

According to an embodiment of the invention, in the RRAM structure, a shape formed by the protection layers in the region between the RRAM cells is an U-shape, for example.

The invention provides a method of manufacturing a resistive random access memory (RRAM) structure including the following steps. A substrate is provided. RRAM cells are formed on the substrate. The RRAM cells are adjacent to each other. Protection layers are respectively formed on sidewalls of the RRAM cells without covering top surfaces of the RRAM cells. Each of the protection layers includes a sidewall portion and an extension portion. The sidewall portion is disposed on each of the sidewalls of each of the RRAM cells. The extension portion is connected to a lower portion of the sidewall portion. An upper portion of the extension portion is lower than an upper portion of the sidewall portion. The extension portion is connected between the sidewall portions in a region between the RRAM cells.

According to an embodiment of the invention, in the method of manufacturing the RRAM structure, wherein a method of forming the protection layers may include the following steps. A protection material layer is conformally formed on the RRAM cells. A photoresist layer is formed. The photoresist layer at least covers the protection material layer located on the sidewalls of the RRAM cells. A removing process is performed on the photoresist layer and the protection material layer until the top surfaces of the RRAM cells are exposed. A removing rate of the photoresist layer is less than or equal to a removing rate of the protection material layer during the removing process.

According to an embodiment of the invention, in the method of manufacturing the RRAM structure, a height of the photoresist layer relative to the substrate is higher than or equal to a height of the protection material layer relative to the substrate, for example.

According to an embodiment of the invention, in the method of manufacturing the RRAM structure, the removing process is an etching back process, for example.

According to an embodiment of the invention, in the method of manufacturing the RRAM structure, each of the RRAM cells may include a bottom electrode, a top electrode and a variable resistance layer. The bottom electrode is disposed on the substrate. The top electrode is disposed on the bottom electrode. The variable resistance layer is disposed between the top electrode and the bottom electrode.

According to an embodiment of the invention, in the method of manufacturing the RRAM structure, the top electrode may be a single-layer structure or a multi-layer structure.

According to an embodiment of the invention, in the method of manufacturing the RRAM structure, each of the RRAM cells may further include a hard mask layer. The hard mask layer is disposed on the top electrode.

According to an embodiment of the invention, in the method of manufacturing the RRAM structure, the RRAM structure may further include a first interconnect structure and a second interconnect structure. The first interconnect structure is electrically connected to the bottom electrode. The second interconnect structure is electrically connected to the top electrode.

According to an embodiment of the invention, in the method of manufacturing the RRAM structure, the sidewall portions may be separated from each other in the region between the RRAM cells.

According to an embodiment of the invention, in the method of manufacturing the RRAM structure, a ratio of a width of each of the sidewall portions to a distance between the RRAM cells is more than or equal to 0.2 and less than 0.5, for example.

According to an embodiment of the invention, in the method of manufacturing the RRAM structure, a shape formed by the protection layers in the region between the RRAM cells is an U-shape, for example.

Based on the above description, in the RRAM structure and the manufacturing method thereof, the protection layer includes the sidewall portion and the extension portion, the sidewall portion s disposed on each of the sidewalls of each of the RRAM cells, the extension portion is connected to the lower portion of the sidewall portion, and the extension portion is connected between the sidewall portions in the region between the RRAM cells. Therefore, the sidewall portion can have a large width to prevent from being etched through in the subsequent etching process, and thus the RRAM can have good electrical performance. Furthermore, since the protection layer does not cover the top surface of the RRAM cell, the protection layer will not interfere with the electrical connection of the RRAM cell.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1D are cross-sectional views illustrating a manufacturing method of a resistive random access memory (RRAM) structure according to an embodiment of the invention.

Figure 1A:
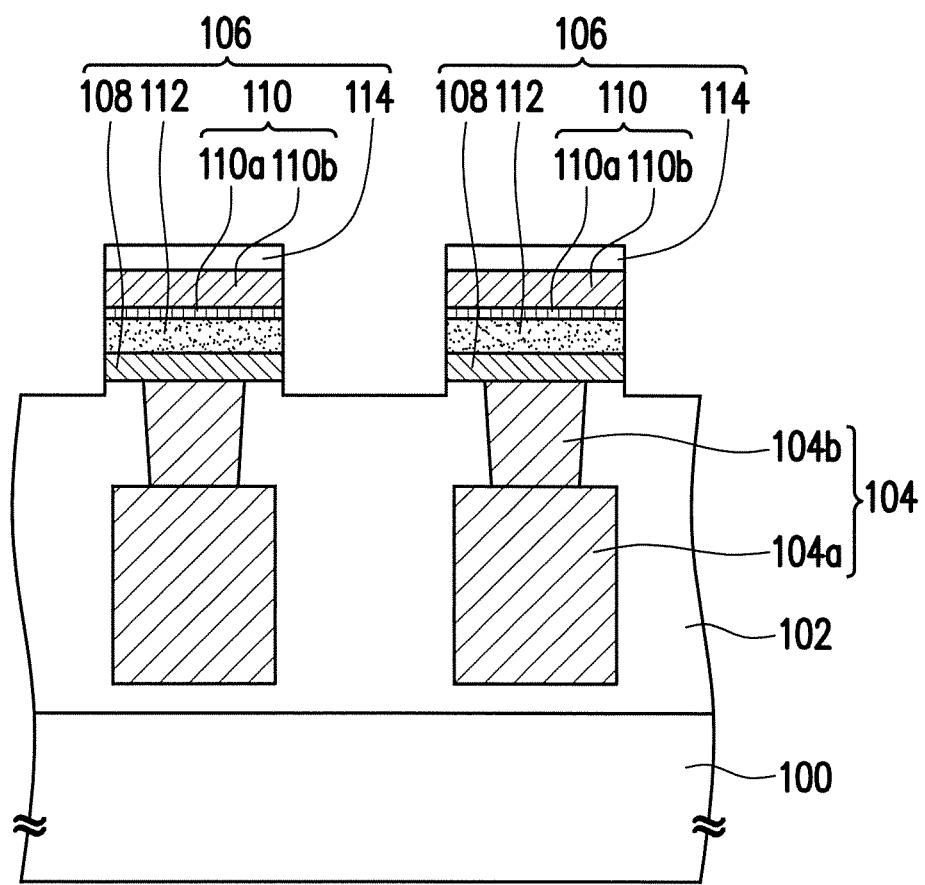
FIG. 1A to FIG. 1D are cross-sectional views illustrating a manufacturing method of a resistive random access memory (RRAM) structure according to an embodiment of the invention.

Referring to FIG. 1A, a substrate 100 is provided. The substrate 100 may be a semiconductor substrate (for example, a silicon substrate). A dielectric layer 102 may be formed on the substrate 100. The dielectric layer 102 may be a single-layer structure or a multi-layer structure. The material of the dielectric layer 102 is silicon oxide, for example. The method of forming the dielectric layer 102 is a chemical vapor deposition (CVD) method, for example.

An interconnect structure 104 may be formed in the dielectric layer 102. The interconnect structure 104 may be a via, a trench or a combination thereof. The interconnect structure 104 may be a single-layer structure or a multi-layer structure. In this embodiment, the interconnect structure 104 is exemplified as the multi-layer structure, but the invention is not limited thereto. For example, the interconnect structure 104 may include an interconnect 104a and an interconnect 104b. A barrier layer (not shown) may be respectively formed between the interconnect 104a and the dielectric layer 102 and between the interconnect 104b and the dielectric layer 102. The material of the interconnect structure 104 is Cu, Al or W, for example. The method of forming the interconnect structure 104 is a damascene method, for example.

RRAM cells 106 are formed on the substrate 100. For example, the RRAM cells 106 may be formed on the dielectric layer 102 and the interconnect structure 104. The RRAM cells 106 are adjacent to each other. Each of the RRAM cells 106 may include a bottom electrode 108, a top electrode 110 and a variable resistance layer 112. Moreover, each of the RRAM cells 106 may further include a hard mask layer 114.

The bottom electrode 108 is disposed on the substrate 100. The material of the bottom electrode 108 is tantalum nitride (TaN), for example. The method of forming the bottom electrode 108 is the CVD method, for example. The bottom electrode 108 may be electrically connected to the interconnect structure 104.

The top electrode 110 is disposed on the bottom electrode 108. The top electrode 110 may be a single-layer structure or a multi-layer structure. In this embodiment, the top electrode 110 is exemplified as the multi-layer structure, but the invention is not limited thereto. For example, the top electrode 110 may include a conductor layer 110a and a conductor layer 110b. The material of the conductor layer 110a is Ir, W or Pt, for example. The method of forming the conductor layer 110a is a physical vapor deposition (PVD) method. The material of the conductor layer 110b is tantalum nitride (TaN), for example. The method of forming the conductor layer 110b is the CVD method.

The variable resistance layer 112 is disposed between the top electrode 110 and the bottom electrode 108. The material of the variable resistance layer 112 is tantalum oxide ($TaO_x$), hafnium oxide ($HfO_x$) or titanium oxide ($TiO_x$), for example. The method of forming the variable resistance layer 112 is the CVD method or the PVD method.

The hard mask layer 114 is disposed on the top electrode 110. The material of the hard mask layer 114 is silicon oxide, for example. The method of forming the hard mask layer 114 is the CVD method, for example.

Figure 1B:
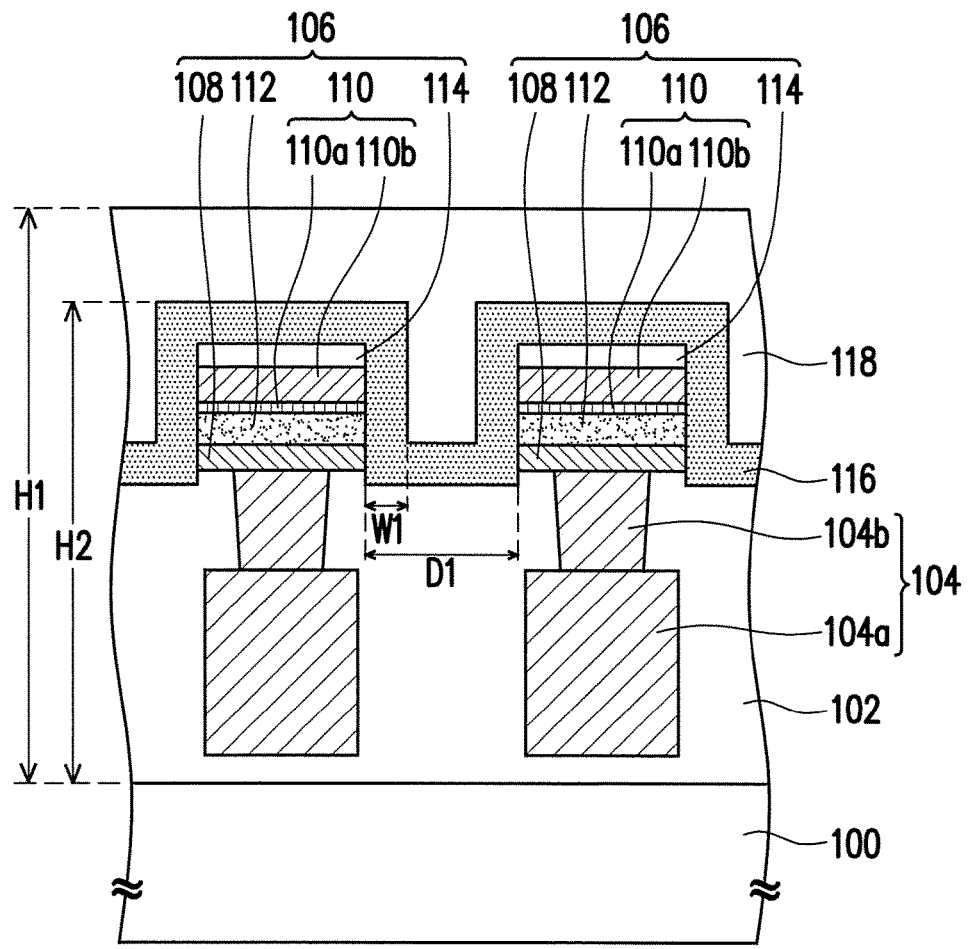

Referring to FIG. 1B, a protection material layer 116 is conformally formed on the RRAM cells 106. The material of the protection material layer 116 is silicon nitride, for example. The method of forming the protection material layer 116 is the CVD method, for example.

A photoresist layer 118 is formed. The photoresist layer 118 at least covers the protection material layer 116 located on the sidewalls of the RRAM cells 106. In this embodiment, the photoresist layer 118 may cover the entire protection material layer 116, but the invention is not limited thereto. In another embodiment, the photoresist layer 118 may only cover the protection material layer 116 located between the RRAM cells 106. A height H1 of the photoresist layer 118 relative to the substrate 100 is higher than or equal to a height H2 of the protection material layer 116 relative to the substrate 100, for example. A ratio of a width W1 of the protection material layer 116 to a distance D1 between the RRAM cells 106 is more than or equal to 0.2 and less than 0.5, for example. The material of the photoresist layer 118 is a positive photoresist material or a negative photoresist material, for example. The method of forming the photoresist layer 118 is a spin-coating method, for example.

Figure 1C:
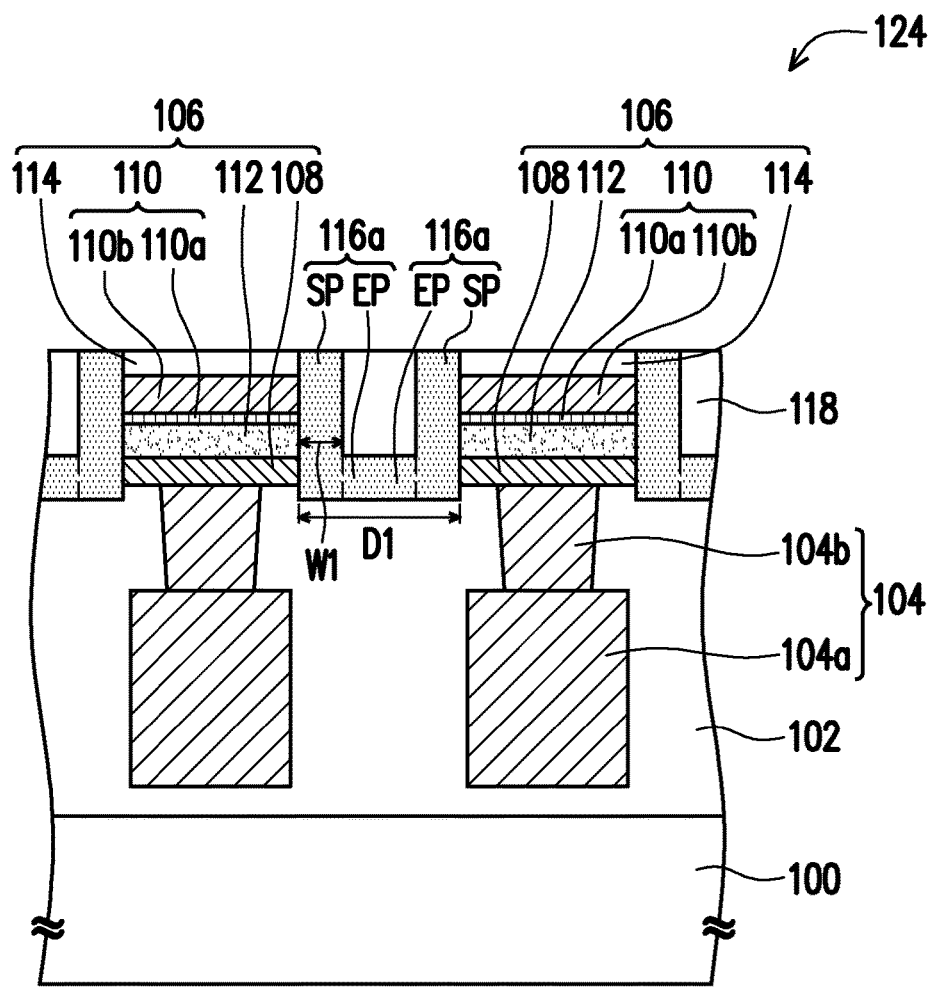

Referring to FIG. 1C, a removing process is performed a on the photoresist layer 118 and the protection material layer 116 until the top surfaces of the RRAM cells 106 are exposed, and thus protection layers 116a are respectively formed on sidewalls of the RRAM cells 106 without covering top surfaces of the RRAM cells 106. A removing rate of the photoresist layer 118 is less than or equal to a removing rate of the protection material layer 116 during the removing process. The removing process is an etching back process, for example. The etchant for the etching back process includes $CF_4$ based etchant. The etching back process is a dry etching process, for example.

Each of the protection layers 116a includes a sidewall portion SP and an extension portion EP. The sidewall portion SP is disposed on each of the sidewalls of each of the RRAM cells 106. The extension portion EP is connected to a lower portion of the sidewall portion SP, wherein the lower portion of the sidewall portion SP is the portion adjacent to substrate 100. An upper portion of the extension portion EP is lower than an upper portion of the sidewall portion SP. The extension portion EP is connected between the sidewall portions SP in a region between the RRAM cells 106. The sidewall portions SP may be separated from each other in the region between the RRAM cells 106. A ratio of the width W1 of each of the sidewall portions SP to the distance D1 between the RRAM cells 106 is more than or equal to 0.2 and less than 0.5, for example. A shape formed by the protection layers 116a in the region between the RRAM cells 106 is an U-shape, for example.

Since the photoresist layer 118 can protect the protection layer 116a during the removing process, the sidewall portion SP can have a large width to prevent from being etched through in the subsequent etching process, and thus the RRAM can have good electrical performance.

Figure 1D:
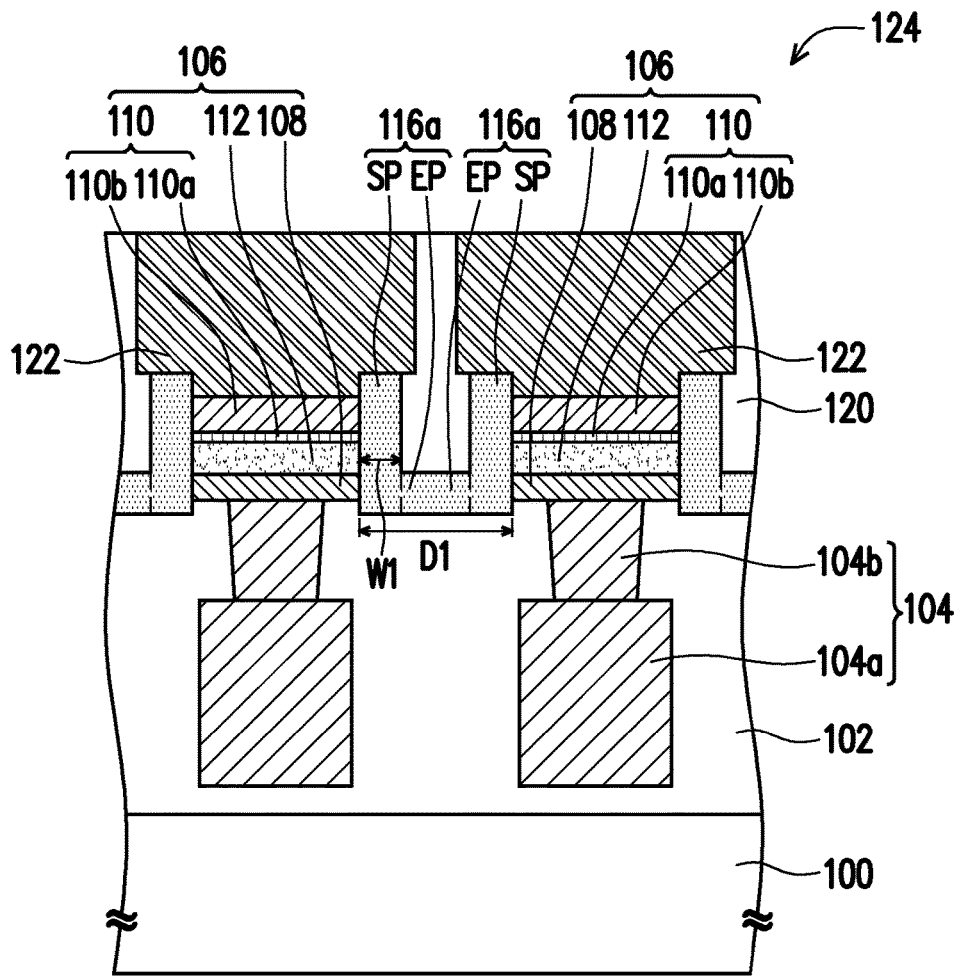

Referring to FIG. 1D, the photoresist layer 118 is removed. The removing method of the photoresist layer 118 is a dry stripping method, for example.

A dielectric layer 120 may be formed on the protection layer 116a and the RRAM cells 106. The dielectric layer 120 may be a single-layer structure or a multi-layer structure. The material of the dielectric layer 120 is silicon oxide, for example. The method of forming the dielectric layer 120 is a chemical vapor deposition (CVD) method, for example.

An interconnect structure 122 may be formed in the dielectric layer 120. The hard mask layer 114 may be removed during the process of forming the interconnect structure 122, and thus the interconnect structure 122 may be electrically connected to the top electrode 110, but the invention is not limited thereto. In another embodiment, the interconnect structure 122 can be electrically connected to the top electrode 110 by passing through the hard mask layer 114 of FIG. 1C. The interconnect structure 122 may be a via, a trench or a combination thereof. The interconnect structure 122 may be a single-layer structure or a multi-layer structure. In this embodiment, the interconnect structure 122 is exemplified as the single-layer structure, but the invention is not limited thereto. A barrier layer (not shown) may be formed between the interconnect 122 and the dielectric layer 120. The material of the interconnect structure 122 is Cu, Al or W, for example. The method of forming the interconnect structure 122 is a damascene method, for example.

Based on the embodiment described above, in the RRAM structure 124, the protection layer 116a includes the sidewall portion SP and the extension portion EP, the sidewall portion SP is disposed on each of the sidewalls of each of the RRAM cells 106, the extension portion EP is connected to the lower portion of the sidewall portion SP, and the extension portion EP is connected between the sidewall portions SP in the region between the RRAM cells 106. Therefore, the sidewall portion SP can have a large width to prevent from being etched through in the subsequent etching process, and thus the RRAM can have good electrical performance. Furthermore, since the protection layer 116a does not cover the top surface of the RRAM cell 106, the protection layer 116a will not interfere with the electrical connection of the RRAM cell 106.

The RRAM structure 124 of this embodiment is described hereinafter with reference to FIG. 1C and FIG. 1D. Although the RRAM structure 124 may be manufactured by the aforementioned manufacturing method in this embodiment, it is merely an example and the manufacturing method of the RRAM structure 124 of the invention is not limited thereto.

Referring to FIG. 1C, the RRAM structure 124 including the substrate 100, RRAM cells 106 and the protection layers 116a. The RRAM cells 106 are adjacent to each other and disposed on the substrate 100. Each of the RRAM cells 106 may include the bottom electrode 108, the top electrode 110 and the variable resistance layer 112, and may further include the hard mask layer 114. The bottom electrode 108 is disposed on the substrate 100. The top electrode 110 is disposed on the bottom electrode 108. The variable resistance layer 112 is disposed between the top electrode 110 and the bottom electrode 108. The hard mask layer 114 is disposed on the top electrode 110. The protection layers 116a are disposed respectively on sidewalls of the RRAM cells 106 without covering top surfaces of the RRAM cells 106. Each of the protection layers 116a includes the sidewall portion SP and the extension portion EP. The sidewall portion SP is disposed on each of the sidewalls of each of the RRAM cells 106. The extension portion EP is connected to the lower portion of the sidewall portion SP. The upper portion of the extension portion EP is lower than the upper portion of the sidewall portion SP. The extension portion EP is connected between the sidewall portions SP in the region between the RRAM cells 106.

Referring to FIG. 1D, the RRAM structure 124 may further include the interconnect structure 104 and the interconnect structure 122. The interconnect structure 104 is electrically connected to the bottom electrode 108. The interconnect structure 122 is electrically connected to the top electrode 110. In this embodiment, the hard mask layer 114 is removed when the interconnect structure 122 is electrically connected to the top electrode 110, but the invention is not limited thereto. In another embodiment, the interconnect structure 122 can be electrically connected to the top electrode 110 by passing through the hard mask layer 114 of FIG. 1C. A barrier layer (not shown) may be formed between the interconnect 122 and the dielectric layer 120.

Furthermore, the material, arrangement, forming method, and efficiency of each component in the RRAM structure 124 have been specified in the above embodiment of the manufacturing method of FIG. 1A to FIG. 1D, and thus are not repeated hereinafter.

In summary, in the RRAM structure 124 and the manufacturing method thereof of the aforementioned embodiments, since the sidewall portion of the protection layer can have a large width to prevent from being etched through in the subsequent etching process, the RRAM can have good electrical performance. Furthermore, since the protection layer does not cover the top surface of the RRAM cell, the protection layer will not interfere with the electrical connection of the RRAM cell.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A resistive random access memory (RRAM) structure, comprising:
   a substrate;
   RRAM cells adjacent to each other and disposed on the substrate; and
   protection layers disposed respectively on sidewalls of the RRAM cells without covering top surfaces of the RRAM cells, wherein each of the protection layers comprises:
   a sidewall portion disposed on each of the sidewalls of each of the RRAM cells; and
   an extension portion connected to a lower portion of the sidewall portion, wherein
   an upper portion of the extension portion is lower than an upper portion of the sidewall portion,
   the extension portion is connected between the sidewall portions in a region between the RRAM cells,
   a top surface of the sidewall portion is higher than the top surfaces of the RRAM cells, and
   a bottom surface of the sidewall portion is lower than bottom surfaces of the RRAM cells.

2. The RRAM structure of claim 1, wherein each of the RRAM cells comprises:
   a bottom electrode disposed on the substrate;
   a top electrode disposed on the bottom electrode; and
   a variable resistance layer disposed between the top electrode and the bottom electrode.

3. The RRAM structure of claim 2, wherein the top electrode comprises a single-layer structure.

4. The RRAM structure of claim 2, wherein each of the RRAM cells further comprises:
   a hard mask layer disposed on the top electrode.

5. The RRAM structure of claim 2, further comprising:
   a first interconnect structure electrically connected to the bottom electrode; and
   a second interconnect structure electrically connected to the top electrode.

6. The RRAM structure of claim 5, wherein the first interconnect structure and the second interconnect structure respectively comprise a via, a trench or a combination thereof.

7. The RRAM structure of claim 1, wherein the sidewall portions are separated from each other in the region between the RRAM cells.

8. The RRAM structure of claim 1, wherein a ratio of a width of each of the sidewall portions to a distance between the RRAM cells is more than or equal to 0.2 and less than 0.5.

9. The RRAM structure of claim 1, wherein a shape formed by the protection layers in the region between the RRAM cells comprises an U-shape.

10. A method of manufacturing a resistive random access memory (RRAM) structure, comprising:
    providing a substrate;
    forming RRAM cells on the substrate, wherein the RRAM cells are adjacent to each other; and
    respectively forming protection layers on sidewalls of the RRAM cells without covering top surfaces of the RRAM cells, wherein each of the protection layers comprises:
    a sidewall portion disposed on each of the sidewalls of each of the RRAM cells; and
    an extension portion connected to a lower portion of the sidewall portion, wherein
    an upper portion of the extension portion is lower than an upper portion of the sidewall portion,
    the extension portion is connected between the sidewall portions in a region between the RRAM cells,
    a top surface of the sidewall portion is higher than the top surfaces of the RRAM cells, and
    a bottom surface of the sidewall portion is lower than bottom surfaces of the RRAM cells.

11. The method of manufacturing the RRAM structure of claim 10, wherein a method of forming the protection layers comprises:
    conformally forming a protection material layer on the RRAM cells;
    forming a photoresist layer, wherein the photoresist layer at least covers the protection material layer located on the sidewalls of the RRAM cells; and
    performing a removing process on the photoresist layer and the protection material layer until the top surfaces of the RRAM cells are exposed, wherein a removing rate of the photoresist layer is less than or equal to a removing rate of the protection material layer during the removing process.

12. The method of manufacturing the RRAM structure of claim 11, wherein a height of the photoresist layer relative to the substrate is higher than or equal to a height of the protection material layer relative to the substrate.

13. The method of manufacturing the RRAM structure of claim 11, wherein the removing process comprises an etching back process.

14. The method of manufacturing the RRAM structure of claim 10, wherein each of the RRAM cells comprises:
    a bottom electrode disposed on the substrate;
    a top electrode disposed on the bottom electrode; and
    a variable resistance layer disposed between the top electrode and the bottom electrode.

15. The method of manufacturing the RRAM structure of claim 14, wherein each of the RRAM cells further comprises:
    a hard mask layer disposed on the top electrode.

16. The method of manufacturing the RRAM structure of claim 14, further comprising:
    a first interconnect structure electrically connected to the bottom electrode; and
    a second interconnect structure electrically connected to the top electrode.

17. The method of manufacturing the RRAM structure of claim 10, wherein the sidewall portions are separated from each other in the region between the RRAM cells.

18. The method of manufacturing the RRAM structure of claim 10, wherein a ratio of a width of each of the sidewall portions to a distance between the RRAM cells is more than or equal to 0.2 and less than 0.5.

19. The method of manufacturing the RRAM structure of claim 10, wherein a shape formed by the protection layers in the region between the RRAM cells comprises an U-shape.

20. The RRAM structure of claim 2, wherein the top electrode comprises a multi-layer structure.

* * * * *